(12) United States Patent
Tsau et al.

(10) Patent No.: US 10,741,400 B2
(45) Date of Patent: Aug. 11, 2020

(54) GATE REPLACEMENT STRUCTURES IN SEMICONDUCTOR DEVICES

(71) Applicant: Taiwan Semiconductor Manufacturing Co., Ltd., Hsinchu (TW)

(72) Inventors: Hsueh Wen Tsau, Zhunan Township (TW); Chia-Ching Lee, New Taipei (TW); Chung-Chiang Wu, Taichung (TW); Da-Yuan Lee, Jhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/173,857

(22) Filed: Oct. 29, 2018

(65) Prior Publication Data

US 2019/0067279 A1 Feb. 28, 2019

Related U.S. Application Data

(62) Division of application No. 15/191,598, filed on Jun. 24, 2016, now Pat. No. 10,128,237.

(51) Int. Cl.
*H01L 29/66* (2006.01)
*H01L 29/49* (2006.01)
(Continued)

(52) U.S. Cl.
CPC .. *H01L 21/28088* (2013.01); *H01L 21/02244* (2013.01); *H01L 21/28079* (2013.01); *H01L 21/32115* (2013.01); *H01L 21/823437* (2013.01); *H01L 29/4958* (2013.01); *H01L 29/4966* (2013.01); *H01L 29/517* (2013.01); *H01L 29/66545* (2013.01); *H01L 29/66795* (2013.01); *H01L 29/7848* (2013.01)

(58) Field of Classification Search
CPC ....... H01L 21/28088; H01L 21/823437; H01L 21/32115; H01L 21/28079; H01L 21/02244; H01L 29/66795; H01L 29/4958; H01L 49/517; H01L 29/4966; H01L 29/66545; H01L 29/7848
See application file for complete search history.

(56) References Cited

U.S. PATENT DOCUMENTS 9,324,820 B1 * 4/2016 Kelly ................ H01L 21/82343
2005/0095852 A1 5/2005 Saenger et al.
(Continued)

*Primary Examiner* — Galina G Yushina
(74) *Attorney, Agent, or Firm* — Sterne, Kessler, Goldstein & Fox P.L.L.C.

(57) ABSTRACT

A semiconductor device structure is provided. The semiconductor device includes a plurality of fins on a substrate, and a metal gate structure disposed on the plurality of fins. The metal gate structure includes a work function metal layer over the plurality of fins, a metal layer on the work function metal layer, and a metal oxide layer on the metal layer. A first portion of the metal oxide layer is formed within an area between adjacent fins from among the plurality of tins. An example benefit includes reduced diffusion of unwanted and/or detrimental elements from the first metal layer into its underlying layers and consequently, the reduction of the negative impact of these unwanted and/or detrimental elements on the semiconductor device performance.

19 Claims, 10 Drawing Sheets

(51) Int. Cl.
*H01L 29/51* (2006.01)
*H01L 21/02* (2006.01)
*H01L 21/8234* (2006.01)
*H01L 21/28* (2006.01)
*H01L 21/321* (2006.01)
*H01L 29/78* (2006.01)

(56) References Cited

U.S. PATENT DOCUMENTS

| | | |
|---|---|---|
| 2006/0208208 A1* | 9/2006 | Isoda .................. C09K 11/7733 250/580 |
| 2009/0179285 A1 | 7/2009 | Wood et al. |
| 2013/0187276 A1 | 7/2013 | Ernst et al. |
| 2013/0200423 A1 | 8/2013 | Yu et al. |
| 2013/0269780 A1 | 10/2013 | Grand et al. |
| 2013/0299914 A1* | 11/2013 | Kim ..................... H01L 27/092 257/369 |
| 2014/0346616 A1* | 11/2014 | Tsai ................... H01L 21/28088 257/411 |
| 2015/0145066 A1 | 5/2015 | Lu et al. |
| 2016/0315088 A1 | 10/2016 | Kang et al. |
| 2017/0373058 A1 | 12/2017 | Tsau et al. |

\* cited by examiner

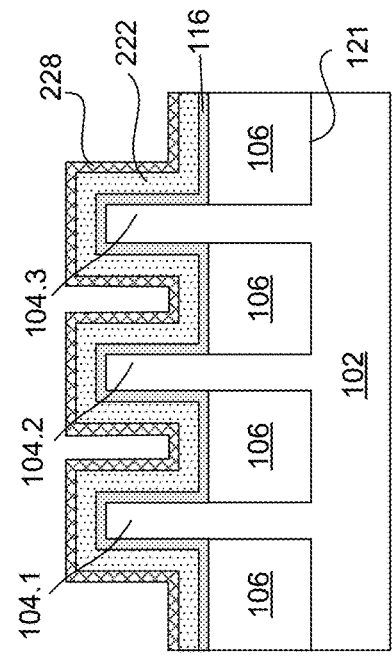
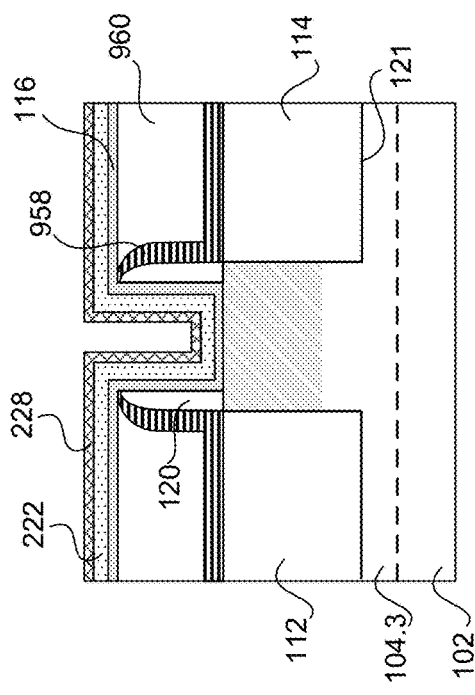
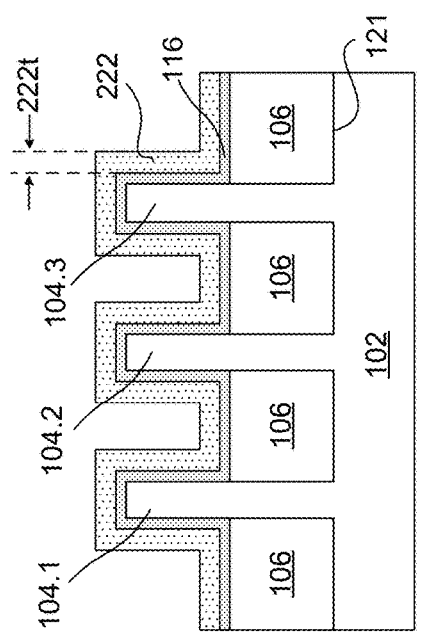
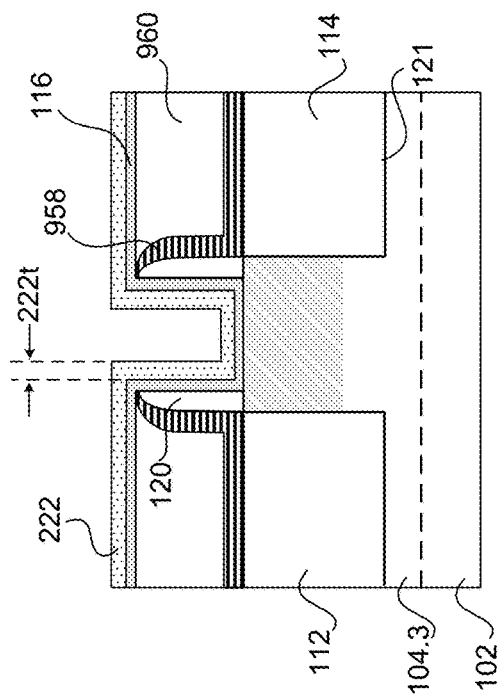

ns in Semiconductor Devices," which was filed on Jun. 24, 2016 and is incorporated herein by reference in its entirety.

BACKGROUND

This disclosure generally relates to semiconductor devices and methods of fabricating the same.

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and finFETs.

Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-8, 9A-15A, and 9B-15B are views of a finFET at various stages of its exemplary fabrication process.

Illustrative embodiments will now be described with reference to the accompanying drawings. In the drawings, like reference numerals generally indicate identical, functionally similar, and/or structurally similar elements.

DETAILED DESCRIPTION

Figure 1:
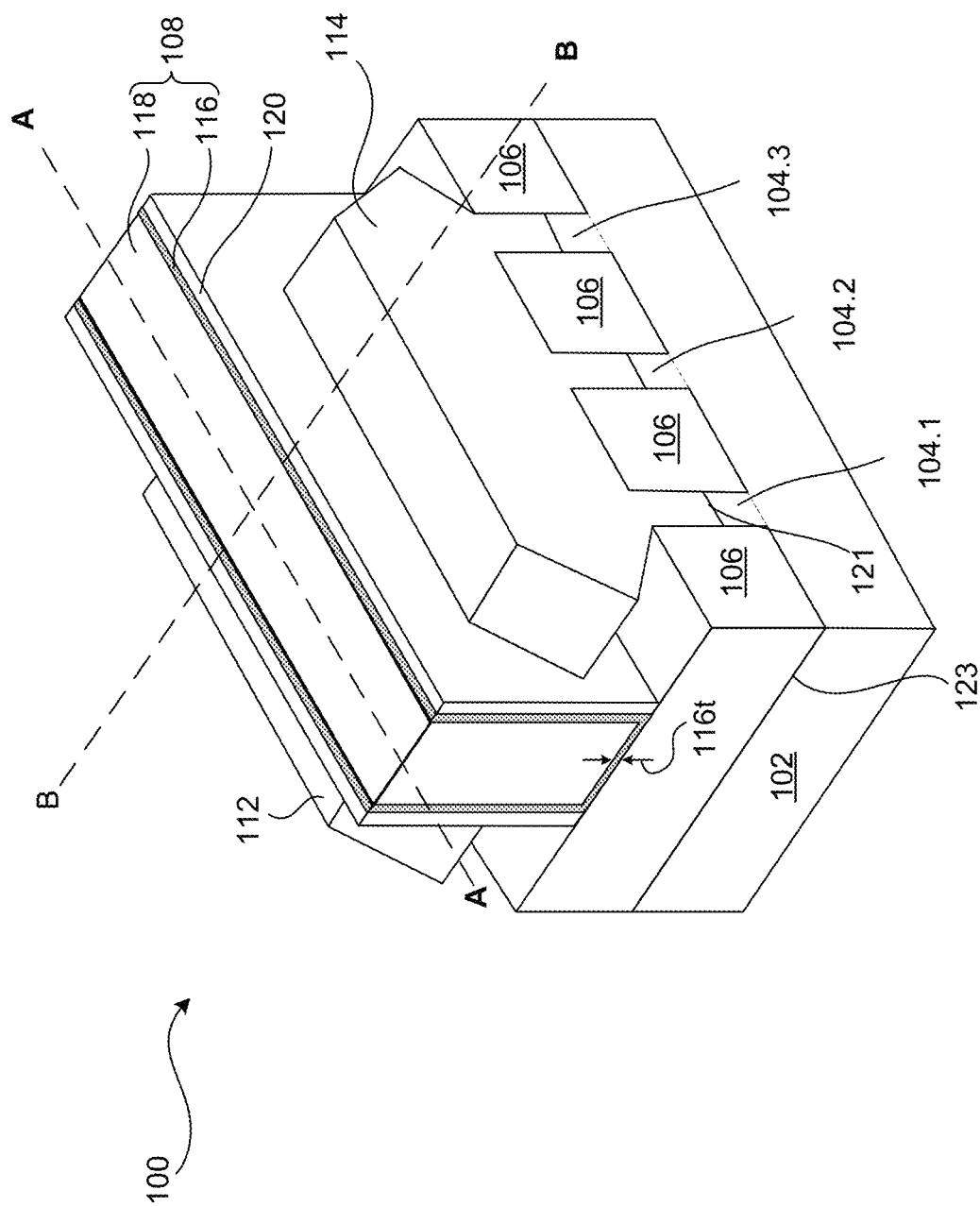
FIG. 1 is an isometric view of an exemplary finFET.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

The term "about" as used herein indicates the value of a given quantity varies by ±10% of the value, or optionally ±5% of the value, or in some embodiments, by ±1% of the value so described. For example, "about 100 nm" encompasses a range from 90 nm to 110 nm, inclusive.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "selectivity" refers to the ratio of the etch rates of two materials under the same etching conditions.

As used herein the term "substrate" describes a material onto which subsequent material layers are added. The substrate itself may be patterned, and materials added on top of it may also be patterned, or may remain without patterning. Furthermore, "substrate" may be any of a wide array of semiconductor materials such as silicon, germanium, gallium arsenide, indium phosphide, etc. Alternatively, the substrate may be electrically non-conductive such as a glass or sapphire wafer.

An Exemplary finFET

FIG. 1 is an isometric view of an exemplary finFET 100 taken after a gate replacement process. FinFET 100 refers to any fin-based, multi-gate transistor. FinFET 100 may be included in a microprocessor, memory cell, and/or other integrated circuit (IC). Although FIG. 1 illustrates finFET 100, it is understood the IC may comprise any number of other devices comprising resistors, capacitors, inductors, fuses, etc. FIG. 1 is for illustrative purposes and is not drawn to scale.

FinFET 100 is formed on a substrate 102, and includes a plurality of fins 104.1 through 104.3, a plurality of shallow trench isolation (STI) regions 106, a gate structure 108 disposed on each of fins 104.1 through 104.3, spacers 120, a source/drain region 112 disposed on one side of gate structure 108, and a source/drain region 114 disposed on another side of gate structure 108. It is understood by those skilled in the relevant art(s) that the names "source" and "drain" can be interchangeable based on the voltage that is applied to those terminals when the transistor is operated. FIG. 1 shows one gate structure 108. However, there may be additional gate structure(s) (not shown) similar and parallel to gate structure 108. In addition, finFET 100 may include other components such as source/drain contacts, gate contacts, vias, interconnect metal layers, dielectric layers, passivation layers, etc. that, for the sake of clarity, are not shown. The isometric view of FIG. 1 is taken after formation of gate structure 108 in a gate replacement process.

Substrate 102 represents a physical material on which finFET 100 is formed. Substrate 102 is a semiconductor material such as, but not limited to, silicon. In some embodiments, substrate 102 comprises a crystalline silicon substrate (e.g., wafer). In some embodiments, substrate 102 comprises another elementary semiconductor, such as diamond or germanium; a compound semiconductor including silicon carbide, gallium arsenide, gallium phosphide, indium phosphide, indium arsenide, and/or indium antimonide; an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or combinations thereof. Yet in some embodiments, substrate 102 includes an epitaxial layer (epi-layer), may be strained for performance enhancement, and/or includes a silicon-on-insulator (SOI) structure. Further, substrate 102 may be doped depending on design requirements (e.g., p-type substrate or n-type substrate). In some embodiments, substrate 102 may be doped with p-type dopants, such as boron or n-type dopants, such as phosphorus or arsenic. The doped substrate 102 may be configured for an n-type finFET, or alternatively configured for a p-type finFET.

Figure 9A:
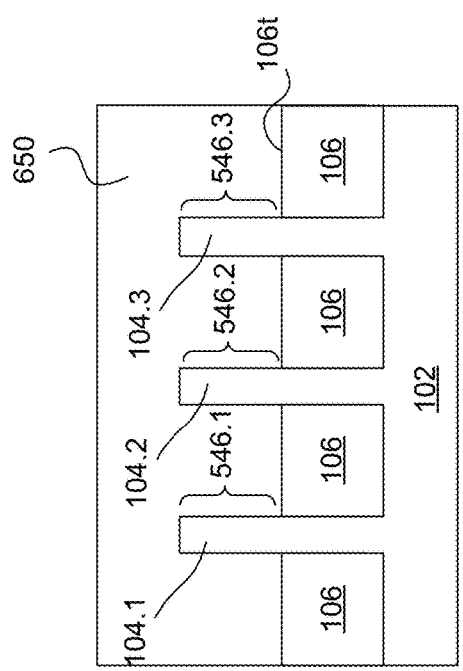

Fins 104.1 through 104.3 represent current carrying structures of finFET 100. Fins 104.1, 104.2, and 104.3 include channel regions (not shown in FIG. 1; a cross-sectional view of channel region 130.3 corresponding to fin 104.3 is shown in FIG. 9A). Each of the channel regions underlies gate structure 108 and is disposed between source/drain regions 112 and 114. Channel regions provide conductive paths between source/drain regions 112 and 114 when a voltage applied to gate structure 108 turns on finFET 100. It should be noted that finFET 100 is shown in FIG. 1 as including three fins 104.1 through 104.3 for the sake of simplicity. However, as would be understood by a person of skill in the art(s), finFET 100 may include any suitable number of fins. This suitable number can include a single fin as well as multiple fins similar to those illustrated in FIG. 1.

STI regions 106 provide electrical isolation of finFET 100 from neighboring active and passive elements (not illustrated in FIG. 1) integrated with or deposited onto substrate 102. Additionally, STI regions 106 provide electrical isolation between each of fins 104.1 through 104.3 and/or between fins 104.1 through 104.3 and the neighboring active and passive elements. STI regions 106 are made of dielectric material. In some embodiments, STI regions 106 includes silicon oxide, silicon nitride, silicon oxynitride, fluorine-doped silicate glass (FSG), a low-k dielectric material, and/or other suitable insulating material. In some embodiments, STI regions 106 include a multi-layer structure, for example, having one or more liner layers.

FinFET 100 further includes an interface 121 between fins 104.1 through 104.3 and source/drain regions 112 and 114 and an interface 123 between STI regions 106 and substrate 102. In some embodiments, interface 121 is coplanar with interface 123. In some embodiments, interface 121 is either above or below interface 123. In some embodiments, interface 121 is above the level of the top surface of STI regions 106.

Source/drain regions 112 and 114 are formed on fins 104.1 through 104.3. Source/drain regions 112 and 114 include epitaxially grown semiconductor material on recessed portions of fins 104.1 through 104.3 on either side of gate structure 108. In some embodiments, the epitaxially grown semiconductor material is the same material as the material of substrate 102. In some embodiments, the epitaxially grown semiconductor material is a strained semiconductor material that includes a different material from the material of substrate 102. Since the lattice constant of the strained semiconductor material is different from the material of substrate 102, channel regions are strained or stressed to advantageously increase carrier mobility in the channel region of finFET 100 and thereby enhance its performance. The strained semiconductor material may include element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP).

Further, source/drain regions 112 and 114 may be in-situ doped during the epi process. In various embodiments, the epitaxially grown source/drain regions 112 and 114 may be doped with p-type dopants, such as boron or $BF_2$; n-type dopants, such as phosphorus or arsenic; and/or combinations thereof; epitaxially grown strained SiGe source/drain regions 112 and 114 may be doped with p-type dopants, such as boron or $BF_2$, n-type dopants, such as phosphorus or arsenic, and/or combinations thereof; epitaxially grown Si source/drain regions 112 and 114 may be doped with carbon to form Si:C source/drain regions 112 and 114, phosphorous to form Si:P source/drain regions 112 and 114, or both carbon and phosphorous to form SiCP source/drain regions 112 and 114. In some embodiments, source/drain regions 112 and 114 are not in-situ doped, and an implantation process (i.e., a junction implant process) is performed to dope source/drain regions 112 and 114.

Gate structure 108 traverses each of fins 104.1 through 104.3 and wraps around a portion of each of fins 104.1 through 104.3 defining the channel regions between source/drain regions 112 and 114. Gate structure 108 controls the current flowing between source/drain regions 112 and 114 through the channel regions. Gate structure 108 includes a dielectric layer 116 and a gate electrode 118. In some embodiments, dielectric layer 116 is adjacent to and in contact with gate electrode 118. In some embodiments, a thickness 116t of dielectric layer 116 is in the range of about 1 nm to about 5 nm. Gate structure 108 may further include interfacial layers at interface between gate structure 108 and fins 104.1 through 104.3, capping layers, etch stop layers, and/or other suitable materials in various embodiments. The interfacial layers may include a dielectric material such as a silicon dioxide layer ($SiO_2$) or silicon oxynitride (SiON) and help to reduce damage between gate structure 108 and fins 104.1 through 104.3. The interfacial dielectric layers may be formed by chemical oxidation, thermal oxidation, atomic layer deposition (ALD), chemical vapor deposition (CVD), and/or other suitable formation processes.

Figure 2:
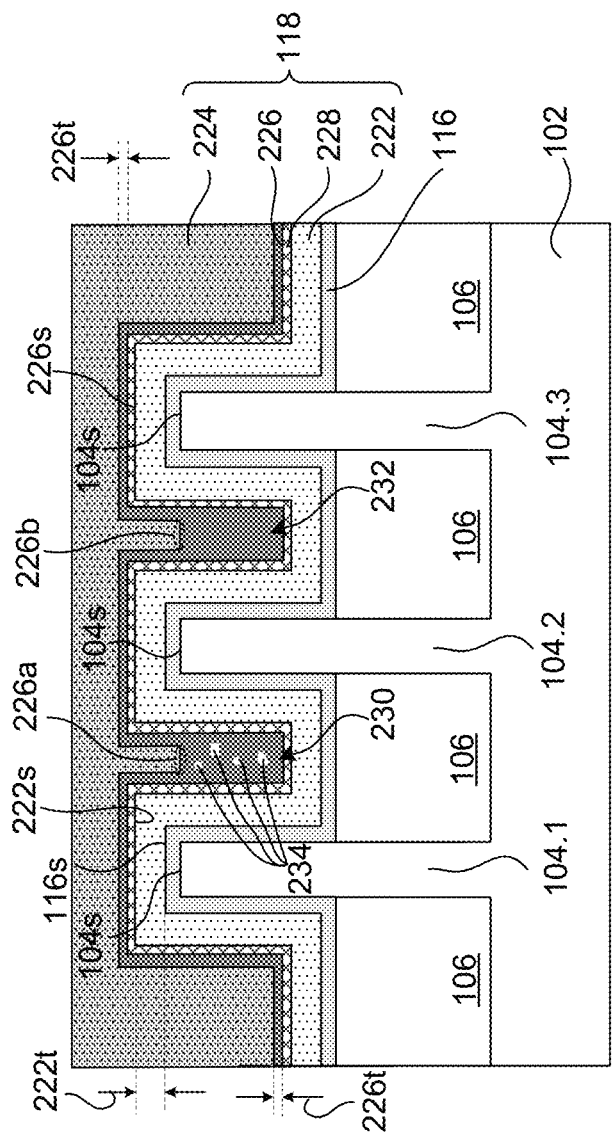
FIG. 2 is a cross-sectional view of an exemplary finFET.

Dielectric layer 116 traverses each of fins 104.1 through 104.3 and wraps around a portion of each of fins 104.1 through 104.3 as illustrated in FIG. 2. FIG. 2 is a cross-sectional view of finFET 100 along line A-A in FIG. 1 in accordance with various embodiments. Dielectric layer 116 may include silicon oxide formed by CVD, ALD, physical vapor deposition (PVD), e-beam evaporation, or other suitable process. In some embodiments, dielectric layer 116 includes one or more layers of silicon oxide, silicon nitride, silicon oxy-nitride, or high-k dielectric materials such as hafnium oxide ($HfO_2$), $TiO_2$, HfZrO, $Ta_2O_5$, $HfSiO_4$, $ZrO_2$, $ZrSiO_2$, or combinations thereof. Alternatively, high-k dielectric materials may comprise metal oxides. Examples of metal oxides used for high-k dielectrics include oxides of Li, Be, Mg, Ca, Sr, Sc, Y, Zr, Al, La, Ce, Pr, Nd, Sm, Eu, Gd, Tb, Dy, Ho, Er, Tm, Yb, Lu, and/or mixtures thereof. The high-k dielectric layer may be formed by ALD and/or other suitable methods. In some embodiments, dielectric layer 116 includes a single layer or a stack of insulating material layers. Spacers 120 are in substantial contact with dielectric layer 116.

Referring to FIG. 2, gate electrode 118 may include a gate work function metal layer 222, a gate metal fill layer 224, and gate metal oxide layer 226, as illustrated in FIG. 2. FIG. 2 is a cross-sectional view of finFET 100 along line A-A in FIG. 1 in accordance with various embodiments. The cross-sectional view is taken after the formation of dielectric layer 116 and gate electrode 118 in a gate replacement process. It should be noted that the exemplary illustration of finFET 100 in FIG. 1 and the exemplary illustration of finFET 100 along line A-A in FIG. 2 may not be to scale. Those skilled in the relevant art will recognize that FIG. 2 is intended to describe additional structures of finFET 100 as well as further describe those structures of finFET 100 that are illustrated in FIG. 1. Those skilled in the relevant art will additionally recognize that finFET 100 need not include all of the additional structures of finFET 100 as illustrated in FIG. 2 without departing from the spirit and scope of this disclosure. Rather, different structures, configurations, and arrangements, as well as different configurations and arrangements for the structures described in FIGS. 1 and 2 are possible for finFET 100.

In some embodiments, gate work function metal layer 222 is disposed on dielectric layer 116. Gate work function metal layer 222 may include a single metallic layer or a stack of metallic layers. The stack of metallic layers may include metals having work functions similar to or different from each other. In some embodiments, gate work function metal layer 222 includes any suitable material, such as aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), TaC, TaSiN, TaCN, TiAl, TiAlN, WN, metal alloys, and/or combinations thereof. Exemplary work function metal(s) that may be included in gate work function metal layer 222 in a p-type device include TiN, TaN, Ru, Mo, Al, WN, ZrSi2, MoSi2, TaSi2, NiSi2, WN, other suitable p-type work function metals, or combinations thereof. Exemplary work function metal(s) that may be included in work function metal layer 222 in an n-type device include Ti, Ag, TaAl, TaAlC, TiAlN, TaC, TaCN, TaSiN, Mn, Zr, other suitable n-type work function materials, or combinations thereof. Gate work function metal layer 222 may be formed using a suitable process such as ALD, CVD, PVD, plating, or combinations thereof. In some embodiments, a thickness 222t of gate work function metal layer 222 is in the range of about 2 nm to about 15 nm.

Gate work function metal layer 222 is one of the factors that controls the finFET threshold voltage and thus the current flow between source/drain regions 112 and 114. A work function is associated with the composition of the one or more metals included in gate work function metal layer 222. The one or more metals are chosen to determine the work function of gate work function metal layer 222 so that a desired threshold voltage is achieved. In some embodiments, the work function of the one or more metals is in the range of about 4 eV to about 6 eV.

Gate metal fill layer 224 may include a single metal layer or a stack of metallic layers. The stack of metallic layers may include metals different from each other. In some embodiments, gate metal fill layer 224 includes any suitable conductive material, such as Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. Gate metal fill layer 224 may be formed by ALD, PVD, CVD, or other suitable conductive material deposition process. In an embodiment, gate metal fill layer 224 includes W film formed by ALD or CVD. The W film may include fluorine in the form of fluoride ions introduced from a fluorine-based precursor (e.g., tungsten hexafluoride (WF)) used during the W film deposition process. In another embodiment, gate metal fill layer 224 includes Al or Co film formed by ALD or CVD.

Typically, current devices having W, Al, Co, or other suitable metals included in gate metal fill layers in gate electrodes suffer from poor device performance due to diffusion of fluorine from W, Al from Al, Co, or other elements from other suitable metals into one or more underlying layers such as gate work function metal layers (e.g., gate work function metal layer 222), dielectric layers (e.g., dielectric layer 116), fins (e.g., fins 104.1 through 104.3), and/or other layers and/or structures of the current devices. The presence of such contaminants in considerable amount adversely affects the chemical and physical properties of the materials of the underlying layers of the current devices. For example, diffusion of fluorine contaminants into underlying gate work function metal layers can negatively affect the work function value of the one or more metals included in the gate work function metal layers of current devices, and consequently, have negative effect on the control and tuning of the threshold voltage of the current devices.

In order to prevent and/or reduce the diffusion of unwanted elements from gate metal fill layers into underlying layer(s) and/or structure(s) of the current devices, the present disclosure describes passivation layers such as gate metal oxide layer 226, according to various embodiments. Gate metal oxide layer 226 may be interposed between gate metal fill layer 224 and gate work function metal layer 222. In one embodiment of finFET 100, gate metal oxide layer 226 covers surface areas underlying gate metal fill layer 224. In another embodiment, gate metal oxide layer 226 may partially or completely fill the areas between fins 104.1 through 104.3 such as areas 230 and/or 232. In some embodiments, top surface portion 226a of gate metal oxide layer 226 within area 230 and/or top surface portion 226b of gate metal oxide layer 226 is below or coplanar with top surface portion 226s of gate metal oxide layer 226, top surface portion 222s of gate work function metal layer 222, top surface portion 116s of dielectric layer 116, or top surfaces 104s of fins 104.1 through 104.3. Top surface portions 226s, 222s, 116s are surface portions that are disposed over fins 104.1 through 104.3. In some embodiments, top surface portions 226a and/or 226b are above surface 222s, surface 116s, or top surface 104s. Gate metal oxide layer 226 may include voids or air pockets of different shapes and sizes such as voids or air pockets 234. Even though voids or air pockets 234 are illustrated to be included only in a portion of gate metal oxide layer 226 within area 230, the present disclosure is not limited to this illustration. Voids or air pockets of any shape and size and in any number may be formed in any portion of gate metal oxide layer 226. In some embodiments, gate metal oxide layer 226 is a continuous layer and does not include voids or air pockets. In some embodiments, gate metal oxide layer 226 is formed only within areas 230 and 232 and not over STI regions 106 and fins 104.1 through 104.3 (not shown).

Presence of gate metal oxide layer 226 reduces the diffusion surface area for unwanted and/or detrimental elements to diffuse from gate metal fill layer 224 into one or more layers underlying gate metal oxide layer 226. Consequently, gate metal oxide layers 226 helps to prevent and/or reduce the diffusion of unwanted and/or detrimental elements from gate metal fill layer 224 into one or more underlying layers such as gate work function metal layer 222, dielectric layer 116, fins 104.1 through 104.3, and/or source/drain regions 112 and 114 during subsequent processing of finFET 100. Gate metal oxide layer 226 may include any suitable metal oxide such as oxides of W, Al, Co, Ti, Ag, Mn, Zr, Cu, Ni, and/or combinations thereof. The one or more materials included in gate metal oxide layer 226 may be selected based on their property and ability to hinder or prevent diffusion of the unwanted elements from gate metal fill layer 224 into the one or more layers underlying gate metal oxide layer 226. In some embodiments, thickness 226t of gate metal oxide layer 226 over fins 104.1 through 104.3 and STI regions 106 ranges from about 0.5 nm to about 1 nm.

Referring to FIG. 2, additionally or optionally, gate electrode 118 includes a gate metal liner 228 interposed between gate work function metal layer 222 and gate metal oxide layer 226 in some embodiments. Gate metal liner 228 may be disposed on gate work function metal layer 222. Gate metal liner 228 may include any suitable metal such as W, Al, Co, Ti, Ag, Mn, Zr, Cu, Ni, and/or combinations thereof and may be formed by ALD, PVD, CVD, or other suitable metal deposition process.

Gate metal liner 228 may serve as a metal precursor for the formation of gate metal oxide layer 226. Gate metal oxide layer 226 may be formed by oxidizing gate metal liner 228 using any suitable oxidation process such as, but not limited to, air oxidation (i.e., exposure to air), $O_2$ plasma process, or a wet or dry thermal oxidation in an ambient comprising an oxide, $H_2O$, NO, or a combination thereof. In some embodiments, gate metal liner 228 is deposited in a deposition chamber and exposed to air by breaking vacuum in the deposition chamber after the deposition to form gate metal oxide layer 226. In some embodiments, gate metal liner 228 is deposited in a deposition chamber and thermally oxidized to gate metal oxide layer 226 at an oxidation temperature of the material included in gate metal liner 228. In some embodiments, surface and/or several topmost atomic layers of gate metal liner 228 is oxidized to form gate metal oxide layer 226. In other embodiments, gate metal liner 228 is completely oxidized to form gate metal oxide layer 226, which is disposed on gate work function metal layer 222 (not shown).

An Example Method for Fabricating a finFET

FIGS. 3-8 are isometric views of finFET 100 (as illustrated in FIGS. 1 and 2) at various stages of its exemplary fabrication. FIGS. 9A-15A and FIGS. 9B-15B are cross-sectional views along line A-A and line B-B, respectively, of finFET 100 of FIG. 1 at various stages of its exemplary fabrication.

Figure 3:
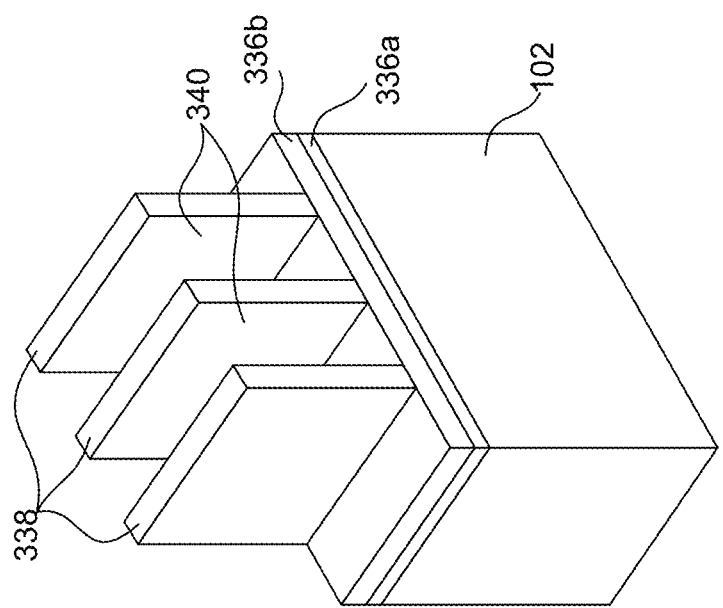

FIG. 3 is an isometric view of a partially fabricated finFET 100 after patterning of photoresist on substrate 102 for formation of fins 104.1 through 104.3. Fins 104.1 through 104.3 are formed by etching into substrate 102. A pad layer 336a and a mask layer 336b are formed on substrate 102. Pad layer 336a may be a thin film comprising silicon oxide formed, for example, using a thermal oxidation process. Pad layer 336a may act as an adhesion layer between substrate 102 and mask layer 336b. Pad layer 336a may also act as an etch stop layer for etching mask layer 336b. In an embodiment, mask layer 336b is formed of silicon nitride, for example, using low pressure chemical vapor deposition (LPCVD) or plasma enhanced CVD (PECVD). Mask layer 336b is used as a hard mask during subsequent photolithography processes. A photoresist layer 338 is formed on mask layer 336b and is then patterned, forming openings 340 in photo-sensitive layer 338.

Figure 4:
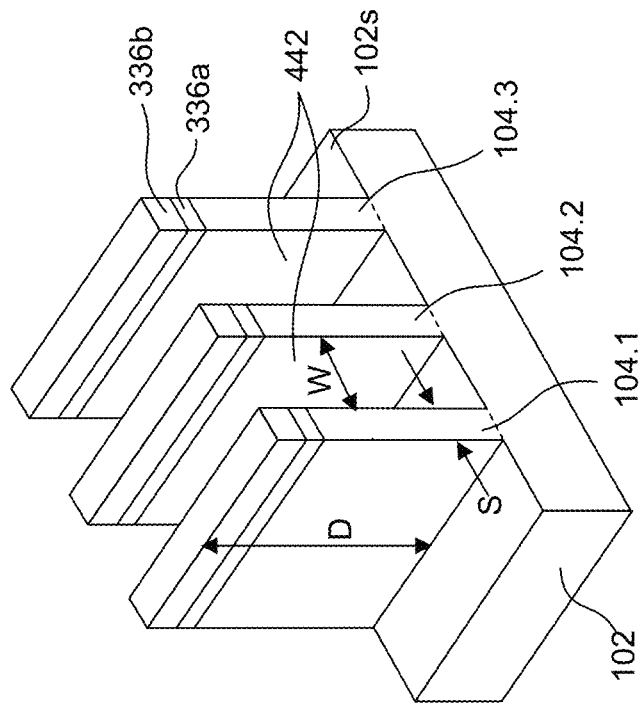

FIG. 4 is an isometric view of a partially fabricated finFET 100 after the exemplary formation of fins 104.1 through 104.3. Mask layer 336b and pad layer 336a are etched through openings 340 to expose underlying substrate 102. The exposed substrate 102 is then etched to form trenches 442 with top surfaces 102s of substrate 102. Portions of substrate 102 between trenches 442 form fins 104.1 through 104.3. Patterned photoresist 338 is then removed. Next, a cleaning may be performed to remove a native oxide of substrate 102. The cleaning may be performed using diluted hydrofluoric (DHF) acid. In some embodiments, trenches 442 are spaced apart from adjacent trenches by a spacing S (i.e., fin widths) smaller than about 30 nm and depth D of trenches 442 ranges from about 210 nm to about 250 nm while width W (i.e., fin spacing) of trenches 442 is less than 50 nm. In some embodiments, the aspect ratio (D/W) of trenches 442 is greater than about 7.0. In other embodiments, the aspect ratio may even be greater than about 8.0. In yet other embodiments, the aspect ratio is lower than about 7.0.

Figure 5:
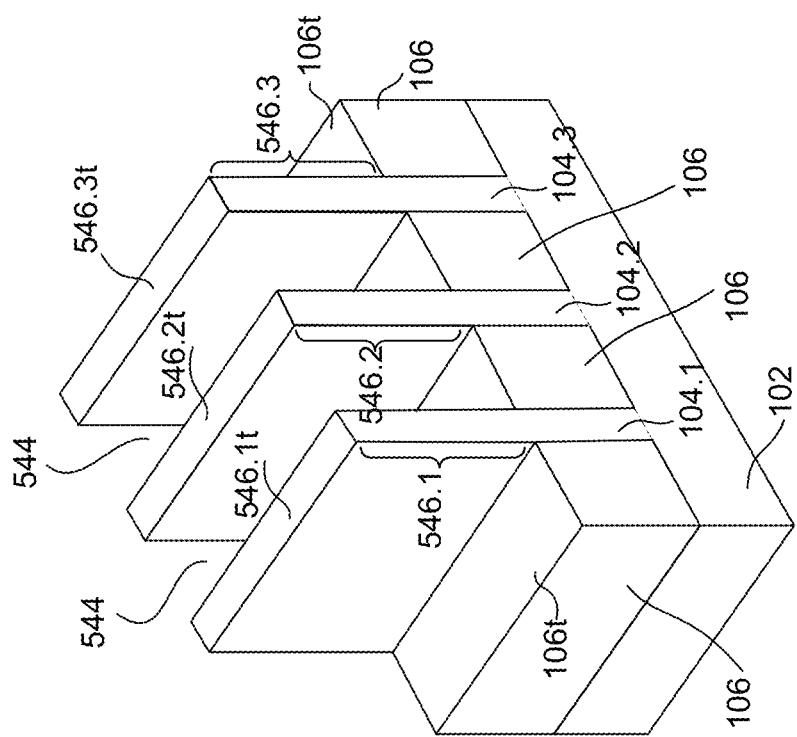

FIG. 5 is an isometric view of a partially fabricated finFET 100 after the exemplary formation of STI regions 106. The formation of STI regions 106 involves deposition and etching of a dielectric material. Trenches 442 are filled with a dielectric material. The dielectric material may include silicon oxide. In some embodiments, other dielectric materials, such as silicon nitride, silicon oxynitride, fluoride-doped silicate glass (FSG), or a low-k dielectric material, may also be used. In some embodiments, the dielectric material may be formed using a flowable CVD (FCVD) process, a high-density-plasma (HDP) CVD process, using silane ($SiH_4$) and oxygen ($O_2$) as reacting precursors. In other embodiments, the dielectric material may be formed using a sub-atmospheric CVD (SACVD) process or high aspect-ratio process (HARP), wherein process gases may comprise tetraethoxysilane (TEOS) and/or ozone ($O_3$). In other embodiments, the dielectric material may be formed using a spin-on-dielectric (SOD) such as hydrogen silsesquioxane (HSQ) or methyl silsesquioxane (MSQ).

A chemical mechanical polish or a wet etch process is then performed for the removal of mask layer 336b and pad layer 336a. This removal is followed by an etching of the dielectric material to form STI regions 106 and recessed regions 544 as shown in FIG. 5. Etching of the dielectric material may be performed using a wet etching process, for example, by dipping substrate 102 in hydrofluoric acid (HF). Alternatively, the etching operation may be performed using a dry etching process, for example, using $CHF_3$ or $BF_3$ as etching gases. Upper fin portions 546.1 through 546.3 of fins 104.1 through 104.3, respectively, protruding over flat top surfaces 106t of STI regions 106 are used to form channel regions of finFET 100. Upper fin portions 546.1 through 546.3 may comprise top surfaces 546.1t through 546.3t, respectively. In some embodiments, flat top surfaces 106t of STI regions 106 are lower than top surfaces 546.1t through 546.3t. In an embodiment, a vertical dimension of each of the upper fin portions 546.1 through 546.3 ranges from about 15 nm to about 50 nm. In another embodiment, a vertical dimension of each of the upper fin portions 546.1 through 546.3 ranges from about 20 nm to about 40 nm. Yet in another embodiment, a vertical dimension of each of the upper fin portions 546.1 through 546.3 ranges from about 25 nm to about 35 nm.

Figure 6:
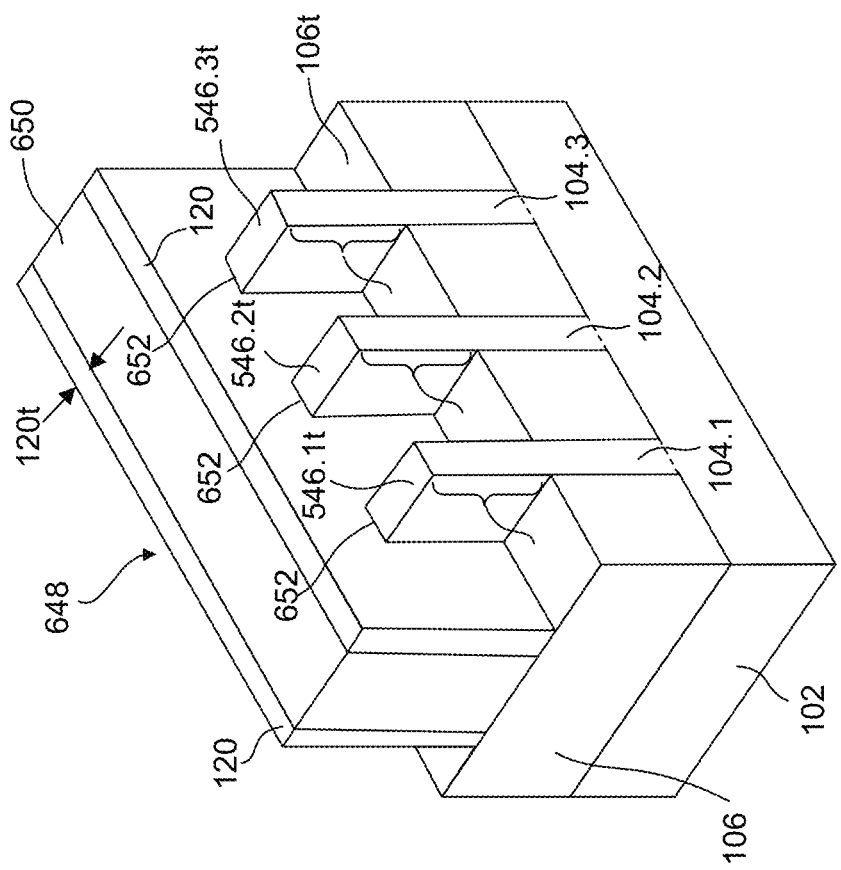

FIG. 6 is an isometric view of a partially fabricated finFET 100 after the exemplary formation of a structure 648 on fins 104.1 through 104.3 and STI regions 106. Structure 648 includes a patterned polysilicon structure 650 and spacers 120. Patterned polysilicon structure 650 and spacers 120 are formed over top surfaces 106t of STI regions 106 and over top surfaces 546.1t through 546.3t to wrap around upper fin portions 546.1 through 546.3. Interfaces 652 are formed between upper fin portions 546.1 through 546.3 and patterned polysilicon structure 650 and spacers 120. Patterned polysilicon structure 650 is formed by any suitable process or processes. For example, patterned polysilicon structure 650 can be formed by a procedure including deposition, photolithography patterning, and etching processes. The deposition processes include CVD, PVD, ALD, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods (e.g., reactive ion etching). Spacers 120 may include dielectric material such as silicon oxide, silicon carbide, silicon nitride, silicon oxy-nitride, or other suitable material. Spacers 120 may comprise a single layer or multilayer structure. A blanket layer of a dielectric material may be formed over patterned polysilicon structure 650 by CVD, PVD, ALD, or other suitable technique followed by an anisotropic etching on the dielectric material to form spacers 120 on two sides of patterned polysilicon structure 650. Each of spacers 120 comprises a thickness 120t in a range from about 5 nm to about 15 nm.

Figure 7:
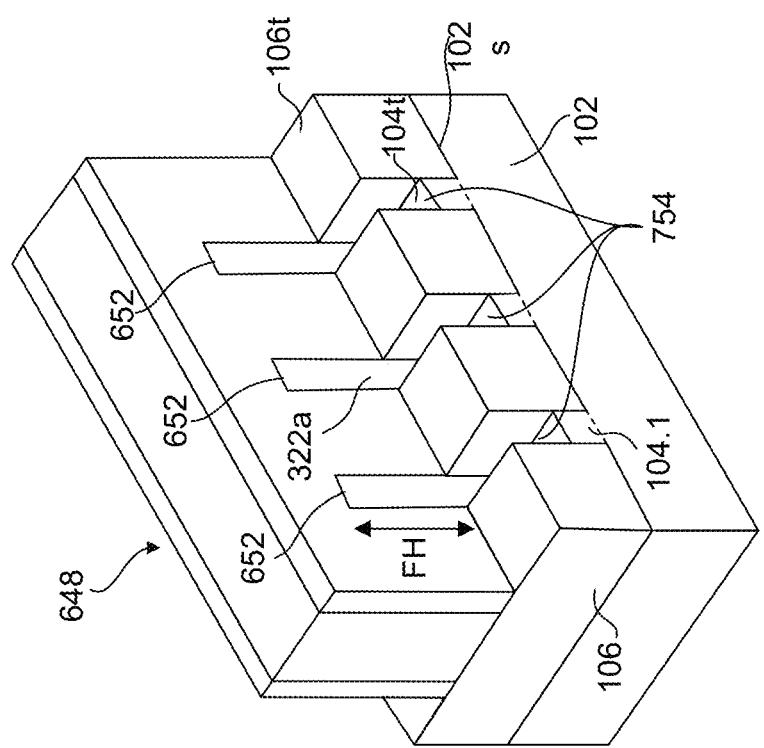

FIG. 7 is an isometric view of a partially fabricated finFET 100 after the exemplary formation of recessed fin portions 754 of fins 104.1 through 104.3. The portions of fins 104.1 through 104.3 that are not covered by structure 648 are recessed to form recessed fin portions 754 of fins 104.1 through 104.3 having surfaces 104t. In an embodiment, surfaces 104t of recessed fin portions 754 are below the flat top surfaces 106t of STI regions 106. In alternative embodiments, the portions of fins 104.1 through 104.3 that are not covered by structure 648 are recessed to expose top surface 102s of substrate 102. In one embodiment, using spacers 120 as masks, a biased etching process is performed to form recessed fin portions 754. The etching process may be performed under a pressure of about 1 mTorr to about 1000 mTorr, a power of about 50 W to about 1000 W, a bias voltage of about 20 V to about 500 V, at a temperature of about 40° C. to about 60° C., and using a HBr and/or $Cl_2$ as etch gases. Also, the bias voltage used in the etching process may be tuned to allow better control of an etching direction to achieve desired profiles for recessed fin portions 754.

Figure 8:
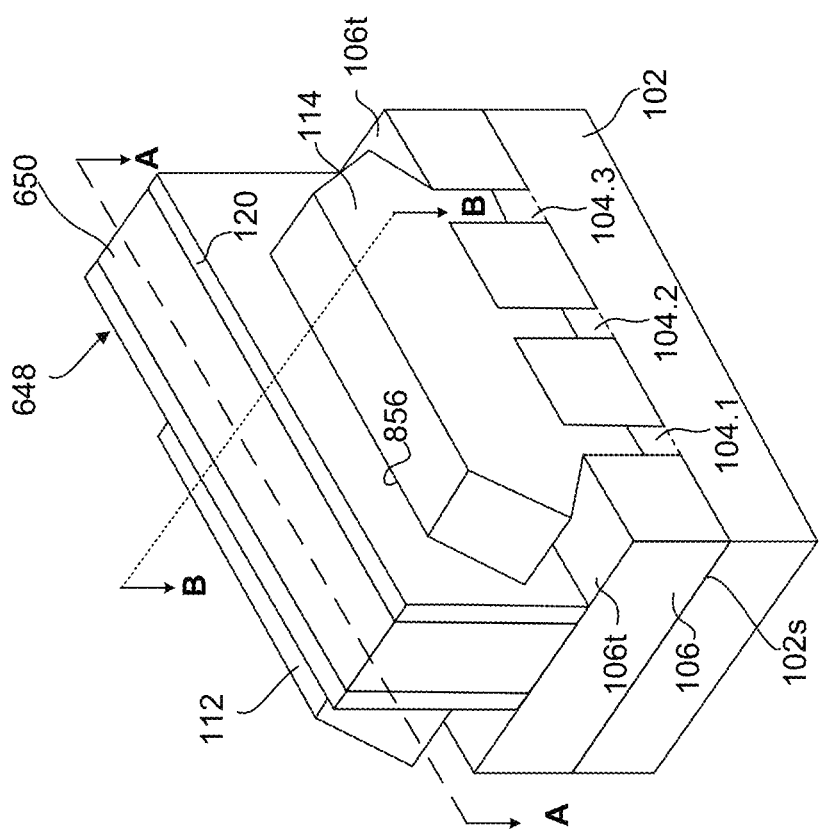

FIG. 8 is an isometric view of a partially fabricated finFET 100 after the exemplary formation of source/drain regions 112 and 114 on recessed fin portions 754 of fins 104.1 through 104.3. Source/drain regions 112 and 114 include epitaxially grown semiconductor material on recessed portions 754 of fins 104.1 through 104.3. Semiconductor material of source/drain regions 112 and 114 is selectively epitaxially grown over recessed portions 754. In some embodiments, the selective epitaxial growth of the semiconductor material of source/drain regions 112 and 114 continues until the semiconductor material extends vertically a distance in a range from about 10 nm to about 100 nm above top surface 102s of substrate 102 and extends laterally over top surfaces 106t of some of the STI regions 106. The semiconductor material includes element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial processes for growing the semiconductor material may include CVD deposition techniques (e.g., LPCVD, vapor-phase epitaxy (VPE) and/or ultra-high vacuum CVD (UHV-CVD)), molecular beam epitaxy, and/or other suitable processes. In an embodiment, the semiconductor material, such as silicon carbon (SiC), is epi-grown by a LPCVD process to form the source/drain regions 112 and 114 of an n-type finFET 100. The LPCVD process is performed at a temperature of about 400 to about 800° C. and under a pressure of about 1 Torr to about 200 Torr, using $Si_3H_8$ and $SiH_3CH$ as reaction gases. In another embodiment, the semiconductor material, such as silicon germanium (SiGe), is epi-grown by a LPCVD process to form source/drain regions 112 and 114 of a p-type finFET 100. The LPCVD process is performed at a temperature of about 400° C. to about 800° C. and under a pressure of about 1 Torr to about 200 Torr, using $SiH_4$ and $GeH_4$ as reaction gases.

Source/drain regions 112 and 114 may be in-situ doped during the epitaxial growth of the semiconductor material. In various embodiments, the epitaxially grown source/drain regions 112 and 114 may be doped with p-type dopants, such as boron or $BF_2$; n-type dopants, such as phosphorus or arsenic; and/or combinations thereof; epitaxially grown SiGe source/drain regions 112 and 114 may be doped with p-type dopants, such as boron or $BF_2$, n-type dopants, such as phosphorus or arsenic, and/or combinations thereof; epitaxially grown Si source/drain regions 112 and 114 may be doped with carbon to form Si:C source/drain features, phosphorous to form Si:P source/drain features, or both carbon and phosphorous to form SiCP source/drain features. In one embodiment, source/drain regions 112 and 114 are not in-situ doped, an ion implantation process is performed to dope source/drain regions 112 and 114. One or more annealing processes may be performed to activate source/drain regions 112 and 114. Annealing processes include but are not limited to rapid thermal annealing (RTA) and/or laser annealing processes.

Further illustrated in FIG. 8 are interfaces 856 between spacers 120 and source/drain regions 112 and 114. In an embodiment, interfaces 856 are coplanar with interfaces 652. In other embodiments, interfaces 856 are either above or below interfaces 652.

Figure 9B:
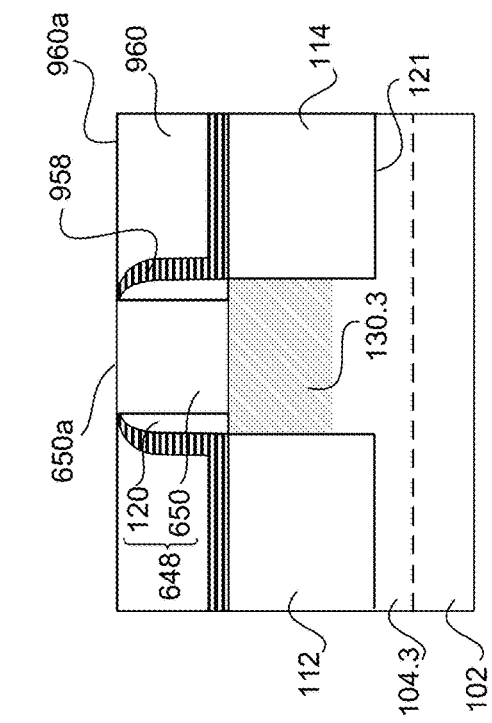

FIGS. 9A-9B are cross-sectional views of the structure of FIG. 8 along lines A-A and B-B, respectively, after exemplary formation of etch stop layer 958 and interlayer dielectric (ILD) layer 960. Patterned polysilicon structure 650 is disposed on top surfaces 106t of STI regions 106 and is wrapped around upper fin portions 546.1 through 546.3, as illustrated in FIG. 9A. Etch stop layer 958 is formed on sides of spacers 120 and on top of source/drain regions 112 and 114, as illustrated in FIG. 9B. Etch stop layer 958 may be used as a mask layer and a protective layer to protect source/drain regions 112 and 114 during formation of source/drain contact structures (not shown). In some embodiments, etch stop layer 958 is be formed of materials including, but not limited to, SiNx, SiOx, SiON, SiC, SiCN, BN, SiBN, SiCBN, and combinations thereof. Etch stop layer 958 may be formed using plasma enhanced chemical vapor deposition (PECVD), sub atmospheric chemical vapor deposition (SACVD), low pressure chemical vapor deposition (LPCVD), ALD, high-density plasma (HDP), plasma enhanced atomic layer deposition (PEALD), molecular layer deposition (MLD), plasma impulse chemical vapor deposition (PICVD), or other suitable deposition methods. In some embodiments, etch stop layer 958 includes a silicon nitride or a silicon oxide formed by a LPCVD, PECVD, or CVD process, or a silicon oxide formed by HARP. In an embodiment, etch stop layer 958 has a thickness in a range from about 20 nm to 200 nm. In another embodiment, etch stop layer 958 has a thickness in a range from about 20 nm to about 100 nm.

Further illustrated in FIG. 9B, ILD layer 960 is formed on etch stop layer 958. Formation of ILD layer 960 may include deposition of a dielectric material, followed by an annealing of the deposited dielectric material and planarization of the annealed dielectric material. The dielectric material of ILD layer 960 may be deposited using any deposition methods suitable for flowable dielectric materials (e.g., flowable silicon oxide, flowable silicon nitride, flowable silicon oxynitride, flowable silicon carbide, or flowable silicon oxycarbide). For example, flowable silicon oxide may be deposited for ILD layer 960 using FCVD process. A wet anneal process may performed on the deposited dielectric material of ILD layer 960. An illustrative wet anneal process includes annealing ILD layer 960 in steam at a temperature in a range from about 200° C. to about 700° C. for a period in a range from about 30 minutes to about 120 minutes. In an embodiment, the dielectric material is silicon oxide. The wet annealed dielectric material of ILD layer 960 may then be planarized by chemical mechanical polishing (CMP). CMP of the wet annealed dielectric material forms ILD layer 960 having top surface 960a which is coplanar with top surface 650a of patterned polysilicon structure 650. During the CMP process, a portion of etch stop layer 958 above structure 648 is removed.

Figure 10A:
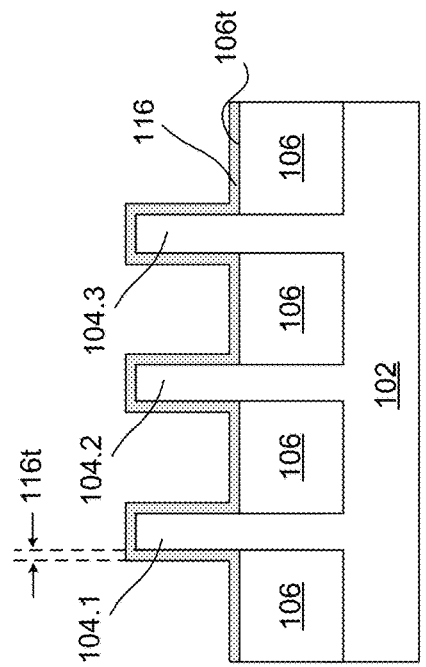
Figure 10B:
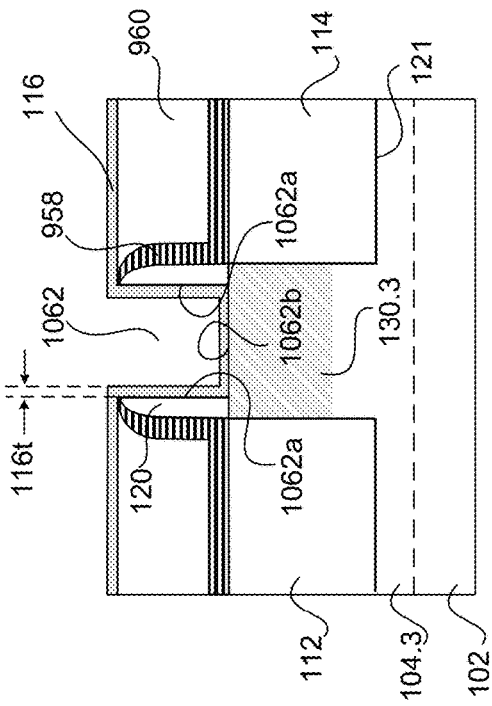

FIGS. 10A-15A and FIGS. 10B-15B show various stages of an exemplary gate replacement process for finFET 100 to replace structure 648 with gate structure 108. FIGS. 10A-10B show respective cross-sectional views of the structure of FIGS. 9A-9B after removal of patterned polysilicon structure 650 followed by deposition of dielectric layer 116, according to some embodiments. Patterned polysilicon structure 650 may be removed by a dry etching process such as reactive ion etching (RIE). The gas etchants used in etching of polysilicon 650 may include chlorine, fluorine, bromine, and/or combinations thereof. FIG. 10A illustrates that dielectric layer 116 is disposed on top surfaces 106t of STI regions 106 and is wrapped around upper fin portions 546.1 through 546.3. Dielectric layer 116 is also disposed along sidewalls 1062a and bottom surface 1062b of trench 1062 formed after removal of patterned polysilicon structure 650, as shown in FIG. 10B. Dielectric layer 116 may include one or more layers of silicon oxide, silicon nitride, silicon oxy-nitride, or high-k dielectric materials such as hafnium oxide ($HfO_2$), $TiO_2$, HfZrO, $Ta_2O_5$, $HfSiO_4$, $ZrO_2$, $ZrSiO_2$, or combinations thereof. Dielectric layer 116 may be formed by CVD, ALD, PVD, e-beam evaporation, or other suitable process. Alternatively, high-k dielectric materials may comprise metal oxides. Examples of metal oxides used for high-k dielectrics include oxides of Li, Be, Mg, Ca, Sr, Sc, Y, Zr, Al, La, Ce, Pr, Nd, Sm, Eu, Gd, Tb, Dy, Ho, Er, Tm, Yb, Lu, and/or mixtures thereof. The high-k dielectric layer may be formed by ALD and/or other suitable methods.

FIGS. 11A-11B show respective cross-sectional views of the structure of FIGS. 10A-10B after exemplary deposition of gate work function metal layer 222. Gate work function metal layer 222 is disposed on dielectric layer 116. In some embodiments, gate work function metal layer 222 includes any suitable material, such as Al, Cu, W, Ti, Ta, TiN, TaN, NiSi, CoSi, Ag, TaC, TaSiN, TaCN, TiAl, TiAlN, WN, metal alloys, and/or combinations thereof. The one or more materials included in gate work function metal layer 222 may be formed using a suitable process such as ALD, CVD, PVD, plating, or combinations thereof. In some embodiments, the deposited gate work function metal layer 222 has a thickness 222t in the range of about 2 nm to about 15 nm.

FIGS. 12A-12B show respective cross-sectional views of the structure of FIGS. 11A and 11B after exemplary deposition of gate metal liner 228. Gate metal liner 228 is disposed on gate work function metal layer 222. Gate metal liner 228 may include any suitable metal such as W, Al, Co, Ti, Ag, Al, Mn, Zr, Cu, Ni, and/or combinations thereof and may be formed by ALD, PVD, CVD, or other suitable metal deposition process.

Figure 13A:
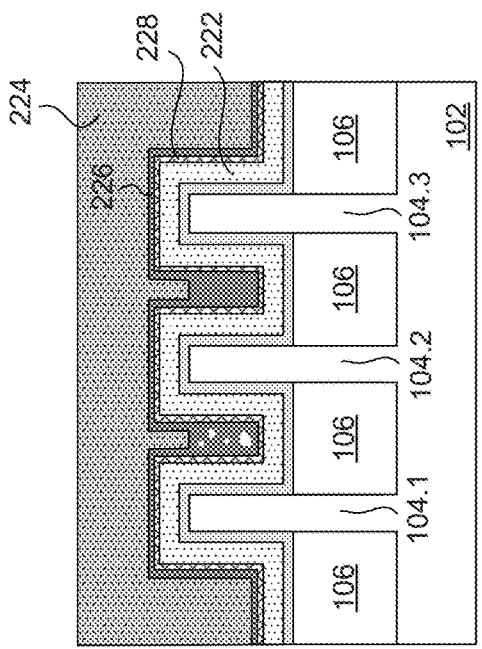
Figure 13B:
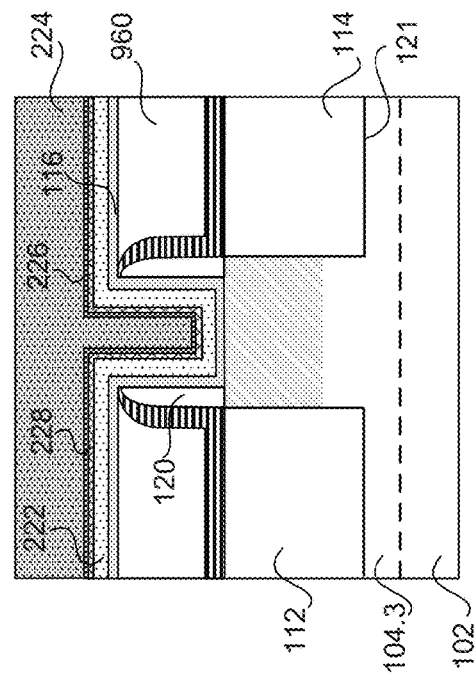

FIGS. 13A-13B show respective cross-sectional views of the structure of FIGS. 12A-12B after exemplary formation of gate metal oxide layer 226. In some embodiments, gate metal oxide layer 226 is formed on gate metal liner 228. Gate metal liner 228 may serve as a metal precursor for the formation of gate metal oxide layer 226. Gate metal oxide layer 226 may be formed by oxidizing gate metal liner 228 using any suitable oxidation process such as, but not limited to, air oxidation (i.e., exposure to air), $O_2$ plasma process, or a wet or dry thermal oxidation in an ambient comprising an oxide, $H_2O$, NO, or a combination thereof. In some embodiments, forming gate metal oxide layer 226 includes depositing gate metal liner 228 in a deposition chamber, breaking vacuum in the deposition chamber after deposition of gate metal liner 228, and exposing gate metal liner 228 to air for a period that ranges from about 1 min to about 15 min. The air may be ambient air that is filtered by HEPA filters. In some embodiments, forming gate metal oxide layer 226 includes depositing gate metal liner 228 in a deposition chamber, introducing oxygen into the deposition chamber, and thermally oxidizing gate metal liner 228 at an oxidation temperature of the material included in gate metal liner 228. In some embodiments, surface and/or several topmost atomic layers of gate metal liner 228 is oxidized to form gate metal oxide layer 226. In other embodiments, gate metal liner 228 is completely oxidized to form gate metal oxide layer 226, which is disposed on gate work function metal layer 222 (not shown). Gate metal oxide layer 226 may include any suitable oxide of metals such as oxide of W, Al, Co, Ti, Ag, Al, Mn, Zr, Cu, Ni, and/or combinations thereof.

Gate metal oxide layer 226 may partially or completely fill the areas between fins 104.1 through 104.3 such as areas 230 and/or 232. In some embodiments, top surface portion 226a of gate metal oxide layer 226 within area 230 and/or top surface portion 226b of gate metal oxide layer 226 is below or coplanar with top surface portion 226s of gate metal oxide layer 226, top surface portion 222s of gate work function metal layer 222, top surface portion 116s of dielectric layer 116, or top surfaces 104s of fins 104.1 through 104.3. Top surface portions 226s, 222s, 116s are surface portions that are disposed over fins 104.1 through 104.3. In some embodiments, top surface portions 226a and/or 226b are above surface 222s, surface 116s, or top surface 104s. Gate metal oxide layer 226 may include voids or air pockets of different shapes and sizes such as voids or air pockets 234. Even though voids or air pockets 234 are illustrated to be included only in a portion of gate metal oxide layer 226 within area 230, the present disclosure is not limited to this illustration. Voids or air pockets of any shape and size and in any number may be formed in any portion of gate metal oxide layer 226. In some embodiments, gate metal oxide layer 226 is a continuous layer and does not include voids or air pockets. In some embodiments, gate metal oxide layer 226 is formed only within areas 230 and 232 and not over STI regions 106 and fins 104.1 through 104.3 (not shown).

Figure 14A:
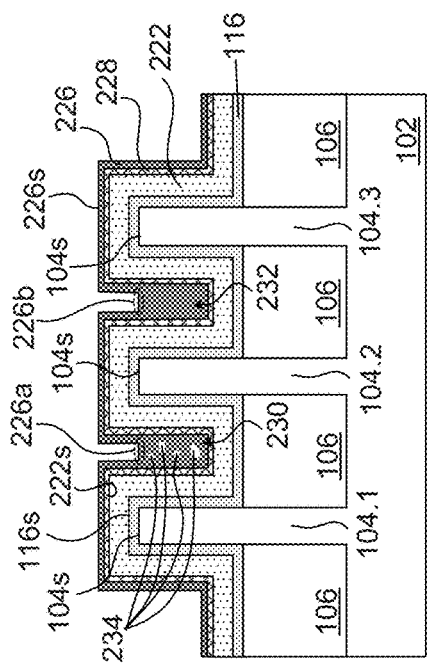
Figure 14B:
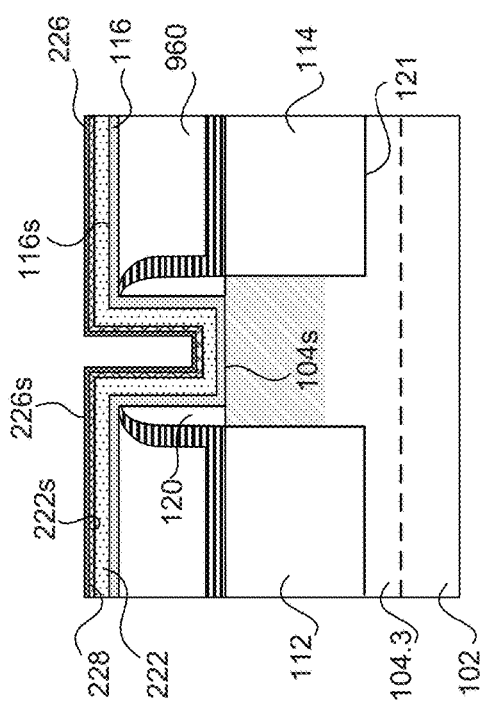

FIGS. 14A-14B show respective cross-sectional views of the structure of FIGS. 13A-13B after exemplary deposition of gate metal fill layer 224. Gate metal fill layer 224 is disposed on gate metal oxide layer 226. Gate metal fill layer 224 may include a single metallic layer or a stack of metallic layers. The stack of metallic layers may include metals different from each other. In some embodiments, gate metal fill layer 224 includes any suitable conductive material, such as Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. Gate metal fill layer 224 may be formed by ALD, PVD, CVD, or other suitable conductive material deposition process. In an embodiment, gate metal fill layer 224 includes W film formed by ALD or CVD. The W film may include fluorine in the form of fluoride ions introduced from a fluorine-based precursor (e.g., tungsten hexafluoride ($WF_6$)) used during the W film deposition process. In another embodiment, gate metal fill layer 224 includes Al or Co film formed by ALD or CVD.

Typically, in current gate replacement processes, fluorine from W-based gate metal fill layer, Al from Al-based gate metal fill layer, Co from Co-based gate metal fill layer, or other elements from other suitable metal based gate metal fill layers diffuse or migrate into one or more underlying layers such as gate work function metal layers (e.g., gate work function metal layer 222), dielectric layers (e.g., dielectric layer 116), fins (e.g., fins 104.1 through 104.3), and/or other layers and/or structures of current devices. The presence of such contaminants in considerable amounts adversely affects the chemical and physical properties of the materials of the underlying layers of the current devices. For example, diffusion of fluorine contaminants in underlying gate work function metal layers can negatively affect the work function value of the one or more metals included in the gate work function metal layers of current devices, and consequently, have negative effect on the control and tuning of the threshold voltage of the current devices. Gate metal oxide layer 226 underlying gate metal fill layer 224 helps to overcome such problems of current gate replacement processes. Gate metal oxide layer 226 may act as a passivation layer to prevent and/or reduce the diffusion of unwanted and/or detrimental elements from gate metal fill layer 224 into one or more underlying layers such as gate work function metal layer 222, dielectric layer 116, fins 104.1 through 104.3, and/or source/drain regions 112 and 114 during subsequent processing of finFET 100.

Figure 15A:
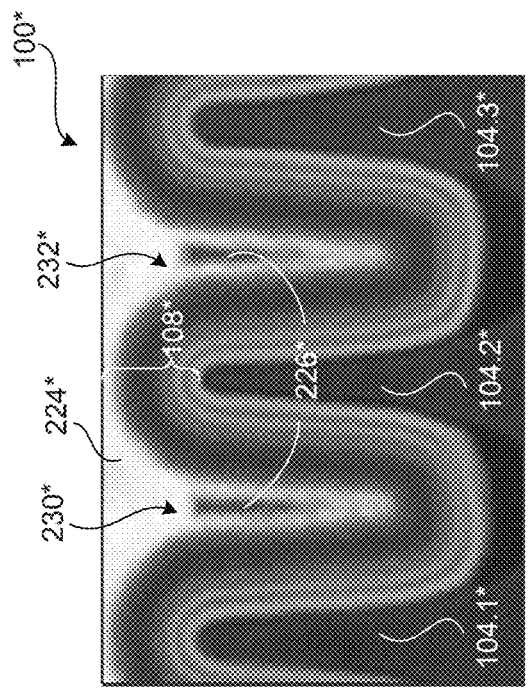
Figure 15B:
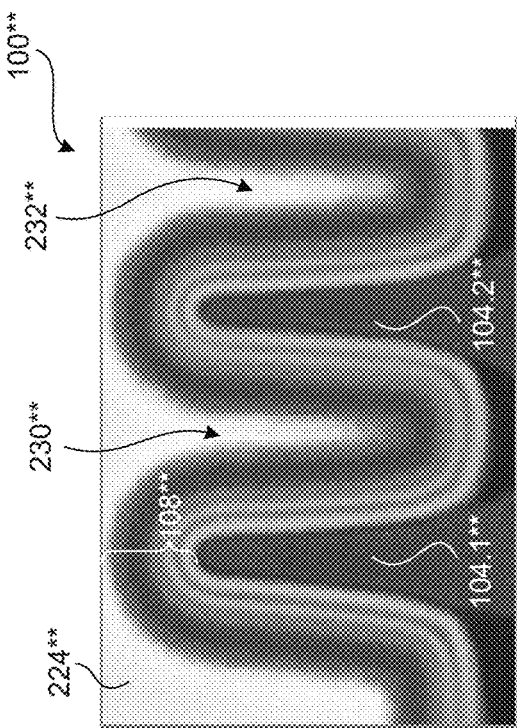

FIGS. 15A-15B show respective cross-sectional views of the structure of FIGS. 14A-14B after exemplary planarization of gate metal fill layer 224, gate metal oxide layer 226, gate metal liner 228, gate work function metal layer 222, and dielectric layer 116. Gate metal fill layer 224, gate metal oxide layer 226, gate metal liner 228, gate work function metal layer 222, and dielectric layer 116 may be planarized using a CMP process. In an embodiment, ILD layer 960 acts as a planarization stop layer during planarizing of these layers. CMP removes excess portions of gate metal fill layer 224, gate metal oxide layer 226, gate metal liner 228, gate work function metal layer 222, and dielectric layer 116, such that top surfaces 224s, 226s, 228s, 222s, and 116s of gate metal fill layer 224, gate metal oxide layer 226, gate metal liner 228, gate work function metal layer 222, and dielectric layer 116, respectively, are coplanar with top surface 960s of ILD 960. It should be noted that even though gate metal liner 228 is shown in gate replacement process of FIGS. 14A-15A and 14B-15B, a person skilled in the art(s) would understand that gate metal liner 228 may not be present at these stages of the gate replacement process if gate metal liner 228 is completely oxidized to form gate metal oxide layer 226 during the oxidation process of gate metal liner 228.

Formation of gate structure 108 shown in FIGS. 15A and 15B may be followed by formation of other elements such as source/drain contacts, gate contacts, vias, interconnect metal layers, dielectric layers, passivation layers, etc., that are not shown for the sake of clarity.

Figure 16:
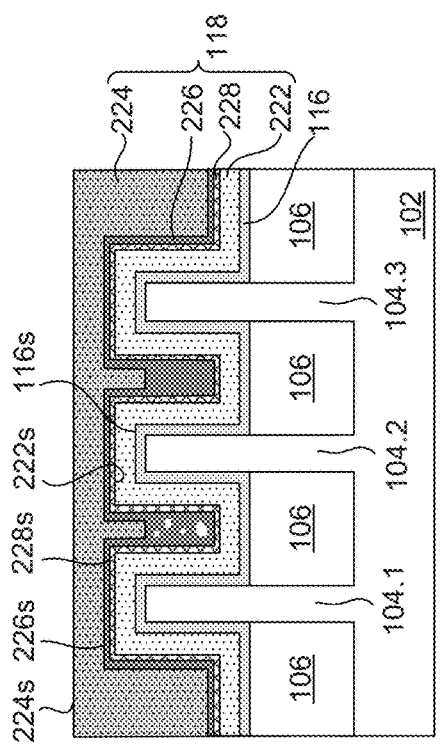
FIG. 16 is an exemplary transmission electron microscopy (TEM) image of a cross-section of an exemplary test structure.

FIG. 16 shows a TEM image of a cross-section of an exemplary test structure 100* across fins 104.1* through 104.3* and structure 108*. In some embodiments, fins 104.1* through 104.3* and structure 108* may be similar to fins 104.1 through 104.3 and gate structure 108 described above. Similar to the gate replacement process described above with respect to FIGS. 10A-15A and 10B-15B, formation of structure 108* includes depositing a W-based metal liner using an ALD process followed by vacuum break and oxidation of the W-based metal liner in air. The oxidation process forms W-based metal oxide 226* within areas 230* and 232* between fins 104.1* through 104.3*. W-based metal oxide 226* may be similar to gate metal oxide layer 226 described above. The oxidation step is followed with a deposition of a W-based metal fill layer 224*, which may be similar to gate metal fill layer 224 described above.

Figure 17:
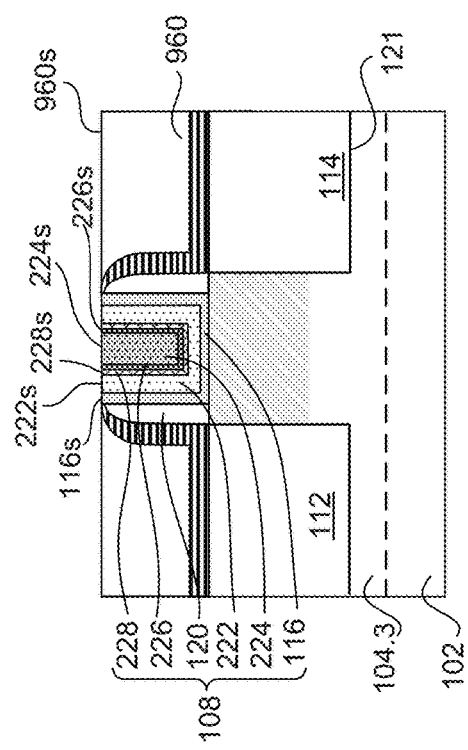
FIG. 17 is a TEM image of a cross-section of a test structure.

In contrast to test structure 100*, FIG. 17 shows a TEM image of a cross-section of another test structure 100 through fins 104.1 and 104.2 and structure 108 where formation of structure 108 includes depositing a W-based metal liner and a W-based metal fill layer in-situ using ALD, that is without breaking vacuum between the depositions. As such, areas 230 and 232 between fins 104.1 and 104.2** are not filled with oxidized W metal liner.

Figure 18:
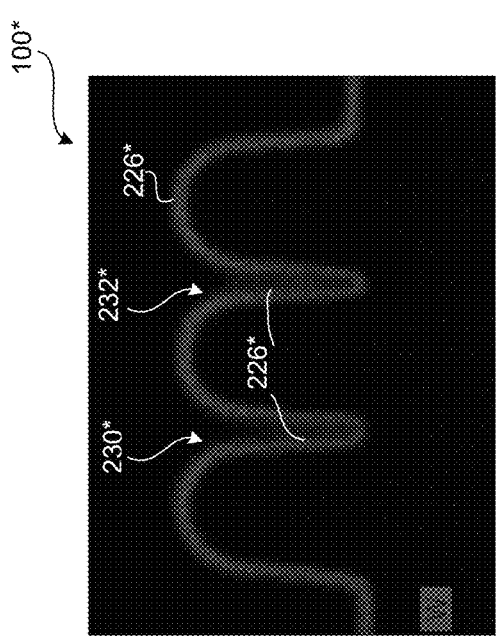
FIGS. 18-19 are exemplary energy-dispersive X-ray spectroscopy (EDX) images of a cross-section of exemplary finFET.
Figure 19:
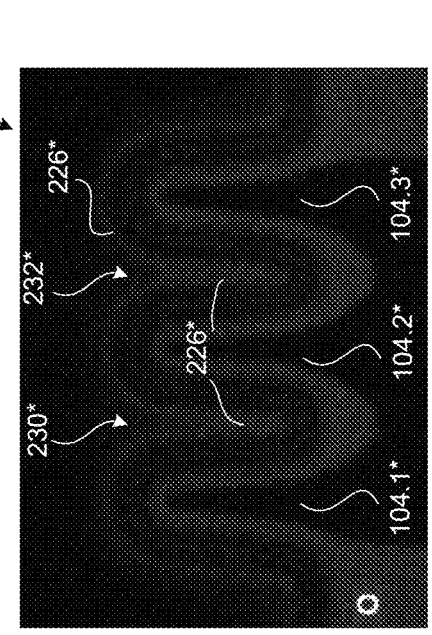

FIGS. 18 and 19 show EDX element maps for tungsten (W) and oxygen (O), respectively, in a cross-section of exemplary test structure 100* across fins 104.1* through 104.3* and structure 108*. The maps are obtained after the formation of W-based metal oxide 226*. The formation of W-based metal oxide 226* within areas 230* and 232* between fins 104.1* through 104.3* is confirmed from the W and O EDX maps. FIG. 18 shows the presence of W within areas 230* and 232*. FIG. 19 shows the presence of O within areas 230* and 232*. FIGS. 18 and 19 also show the presence of W and O over fins 104.1* through 104.3*. This presence may indicate the formation of W-based metal oxide 226* in at least one or more regions over fins 104.1* through 104.3*.

Example Operations for Fabricating a finFET According to an Embodiment

Figure 20:
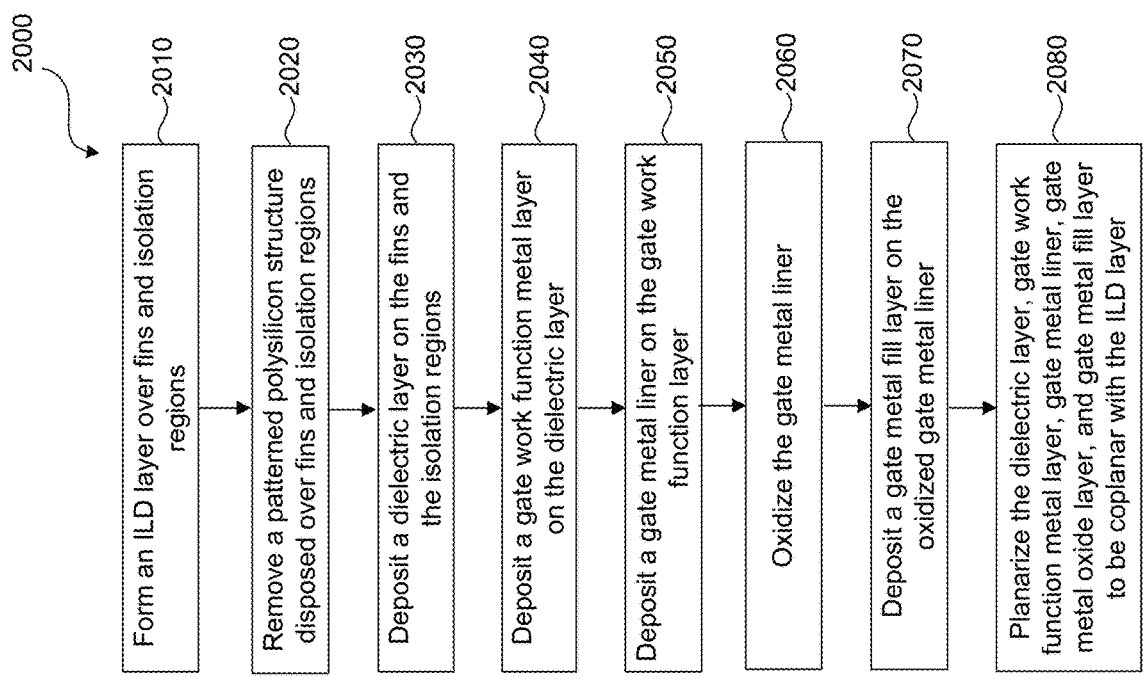
FIG. 20 is a flow diagram of an exemplary method for fabricating a finFET.

FIG. 20 is a flow diagram of an exemplary method 2000 for fabricating finFET 100. Solely for illustrative purposes, the operations illustrated in FIG. 20 will be described with reference to the example fabrication process illustrated in FIGS. 3-8, FIGS. 9A-15A, and 9B-15B. Operations can be performed in a different order or not performed depending on specific applications. It should be noted that method 2000 does not produce a completed finFET 100. Accordingly, it is understood that additional processes may be provided before, during, and after method 2000, and that some other processes may only be briefly described herein.

In operation 2010, an ILD layer is formed over fins and isolation regions. For example, an ILD layer such as ILD layer 960 is formed on fins 104.1 through 104.3 and STI regions 106. Formation of ILD layer 960 may include deposition of a dielectric material, followed by an annealing of the deposited dielectric material and planarization of the annealed dielectric material. The dielectric material of ILD layer 960 may be deposited using any deposition methods suitable for flowable dielectric materials. For example, flowable silicon oxide is deposited for ILD layer 960 using FCVD process. A wet anneal process may performed on the deposited dielectric material of ILD layer 960. The wet annealed dielectric material of ILD layer 960 may then be planarized by CMP.

In operation 2020, a patterned polysilicon structure is removed. For example, patterned polysilicon structure 650 may be removed by a dry etching process such as reactive ion etching (RIE). In some embodiments, the gas etchants used in etching of patterned polysilicon structure 650 may include chlorine, fluorine, bromine, and/or combinations thereof.

In operation 2030, a dielectric layer is deposited on the fins and the isolation regions. For example, a dielectric layer such as dielectric layer 116 is disposed on top surfaces 106t of STI regions 106 and wrapped around upper fin portions 546.1 through 546.3. Dielectric layer 116 may also be disposed along sidewalls 1062a and bottom surface 1062b of trench 1062 formed after removal of patterned polysilicon structure 650 in operation 2020. Dielectric layer 116 may be formed by CVD, ALD, PVD, e-beam evaporation, or other suitable process.

In operation 2040, a gate work function metal layer is deposited on the dielectric layer of operation 2030. For example, a gate work function metal layer such as gate work function metal layer 222 is disposed on dielectric layer 116 using a suitable process such as ALD, CVD, PVD, plating, or combinations thereof.

In operation 2050, a gate metal liner is deposited on the gate work function metal layer of operation 2040. For example, a gate metal liner such as gate metal liner 228 is disposed on gate work function metal layer 222 using a suitable process such as ALD, PVD, CVD, or other suitable metal deposition process.

In operation 2060, a gate metal oxide layer is formed on the gate metal liner of operation 2050. For example, a gate metal oxide layer such as gate metal oxide layer 226 is formed on gate metal liner 228. Gate metal oxide layer 226 may be formed by oxidizing gate metal liner 228 using any suitable oxidation process such as, but not limited to, air oxidation (i.e., exposure to air), $O_2$ plasma process, or a wet or dry thermal oxidation in an ambient comprising an oxide, $H_2O$, NO, or a combination thereof.

In operation 2070, a gate metal fill layer is formed on the gate metal oxide layer of operation 2060. For example, a gate metal fill layer such as gate metal fill layer 224 is disposed on gate metal oxide layer 226. Gate metal fill layer 224 may be formed by ALD, PVD, CVD, or other suitable conductive material deposition process.

In operation 2080, the gate metal fill layer, the gate metal oxide, the gate metal liner, the gate work function metal layer, and the dielectric layer of operations 2070, 2060, 2050, 2040, and 2030 are planarized. For example, gate metal fill layer 224, gate metal oxide 226, gate metal liner 228, gate work function metal layer 222, and dielectric layer 116 may be planarized using CMP. The CMP may coplanarize top surfaces 224s, 226s, 228s, 222s, and 116s of gate metal fill layer 224, gate metal oxide 226, gate metal liner 228, gate work function metal layer 222, and dielectric layer 116, respectively, with top surface 960s of ILD 960.

Thus, the present disclosure provides a modified gate replacement process for a semiconductor device to prevent and/or reduce diffusion of unwanted and/or detrimental elements from a gate metal fill layer into its underlying layers during the gate replacement process and/or during subsequent processing of the semiconductor device. The mechanisms provided herein help to reduce diffusion surface area for unwanted and/or detrimental elements to diffuse from a gate metal fill layer into underlying layers such as gate work function layer(s), gate dielectric layer(s), and/or fin structure(s) of the semiconductor device to improve its device performance. In one embodiment, the mechanism includes oxidizing a gate metal liner deposited on a gate work function layer, followed by deposition of a gate metal fill layer on the oxidized metal liner. The oxidized gate metal liner provides a passivation layer and reduces the diffusion surface area between the gate metal fill layer and its underlying layers. Reduction of the diffusion surface area helps to reduce the negative impact of the unwanted and/or detrimental elements on the material properties and consequently, the electrical performance of layers underlying the gate metal fill layer of the semiconductor device.

Example Embodiments and Benefits

In some embodiments, a semiconductor device includes a plurality of fins on a substrate; and a gate structure. The gate structure includes: a dielectric layer disposed on the plurality of fins; a work function metal layer disposed on the dielectric layer; a metal layer disposed over the work function metal layer; a passivation layer disposed on the metal layer, where a portion of the passivation layer is disposed in an area between adjacent fins of the plurality of fins; and a metal fill layer disposed on the passivation layer.

In some embodiments, a semiconductor device includes: a plurality of fins on a substrate; and a gate structure. The gate structure includes: a dielectric stack disposed on the plurality of fins; a work function layer disposed on the dielectric layer; a first metal layer disposed over the work function layer; a metal oxide layer disposed on the first metal layer, where a portion of the metal oxide layer is disposed in an area between adjacent fins of the plurality of fins; and a second metal layer disposed on the metal oxide layer.

In some embodiments, a semiconductor device includes: a plurality of fins on a substrate; and a gate structure. The gate structure includes a dielectric stack disposed on the plurality of fins; a work function layer disposed on the dielectric layer; a first metal layer disposed over the work function layer; a diffusion barrier layer disposed on the first metal layer, where a portion of the diffusion barrier layer is disposed in an area between adjacent fins of the plurality of fins; and a second metal layer disposed on the diffusion barrier layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a plurality of fins on a substrate; and
a gate structure comprising:
  a dielectric layer disposed on the plurality of fins;
  one or more metal layers disposed on the dielectric layer;
  a metal oxide (MO) layer disposed on the one or more metal layers, wherein a first portion of the MO layer disposed between adjacent fins of the plurality of fins comprises one or more voids and a portion of the MO layer not between the adjacent fins of the plurality of fins is void free; and
  a metal fill layer disposed on the MO layer.

2. The semiconductor device of claim 1, wherein the MO layer partially fills an area between the adjacent fins of the plurality of fins.

3. The semiconductor device of claim 1, wherein the MO layer comprises, aluminum (Al), cobalt (Co), titanium (Ti), silver (Ag), manganese (Mn), zirconium (Zr), copper (Cu), nickel (Ni), or a combination thereof.

4. The semiconductor device of claim 1, wherein the MO layer comprises tungsten (W).

5. The semiconductor device of claim 1, wherein the metal fill layer comprises tungsten, aluminum, or cobalt.

6. The semiconductor device of claim 1, further comprising:
a spacer on each sidewall of the gate structure; and
an interlayer dielectric adjacent to each spacer.

7. A semiconductor device, comprising:
a plurality of fins on a substrate; and
a gate structure comprising:
  a dielectric stack disposed on the plurality of fins;
  a work function layer disposed on the dielectric stack;
  a first metal layer disposed over the work function layer;
  a metal oxide layer disposed on the first metal layer, wherein:
    a first portion of the metal oxide layer comprises voids and is disposed in an area between adjacent fins of the plurality of fins; and
    a second portion of the metal oxide layer is void free and is not disposed in the area between the adjacent fins of the plurality of fins; and
  a second metal layer disposed on the metal oxide layer.

8. The semiconductor device of claim 7, wherein the first portion of the metal oxide layer partially fills the area between the adjacent fins of the plurality of fins.

9. The semiconductor device of claim 7, wherein an interface between the metal oxide layer and the second metal layer is formed below a top surface of at least one fin of the plurality of fins.

10. The semiconductor device of claim 7, wherein the metal oxide layer comprises an oxide of tungsten (W), aluminum (Al), cobalt (Co), titanium (Ti), silver (Ag), manganese (Mn), zirconium (Zr), copper (Cu), nickel (Ni), or a combination thereof.

11. The semiconductor device of claim 7, wherein the first metal layer comprises tungsten (W), aluminum (Al), cobalt (Co), titanium (Ti), silver (Ag), manganese (Mn), zirconium (Zr), copper (Cu), nickel (Ni), or a combination thereof.

12. The semiconductor device of claim 7, wherein the second portion of the metal oxide layer is formed over the plurality of fins.

13. A semiconductor device, comprising:
a plurality of fins on a substrate; and
a gate structure comprising:
  a dielectric stack disposed on top and sidewall surfaces of the plurality of fins;
  a work function layer disposed on the dielectric layer;
  an oxide layer disposed above the work function layer and comprising:
    a first portion disposed between adjacent fins of the plurality of fins and comprising voids; and
    a second portion that is not disposed between the adjacent fins of the plurality of fins and without voids; and
  a metal fill disposed on the oxide layer.

14. The semiconductor device of claim 13, wherein the oxide layer comprises a metal.

15. The semiconductor device of claim 13, wherein the work function layer comprises a stack of metallic layers.

16. The semiconductor device of claim 13, further comprising a metal layer disposed between the work function layer and the oxide layer.

17. The semiconductor device of claim 13, wherein the oxide layer comprises an oxide of tungsten (W), aluminum (Al), cobalt (Co), titanium (Ti), silver (Ag), manganese (Mn), zirconium (Zr), copper (Cu), nickel (Ni), or a combination thereof.

18. The semiconductor device of claim 13, wherein the oxide layer comprises tungsten.

19. The semiconductor device of claim 13, wherein an interface between the oxide layer and the metal fill is formed below or coplanar with a top surface of at least one fin of the plurality of fins.

* * * * *